United States Patent
Sekiguchi et al.

(10) Patent No.: US 6,887,522 B2
(45) Date of Patent: May 3, 2005

(54) METHOD FOR FORMING A COPPER THIN FILM

(75) Inventors: Atsushi Sekiguchi, Tokyo (JP); Masami Shibagaki, Tokyo (JP); Tomoaki Koide, Tokyo (JP); Takafumi Kuninobu, Tokyo (JP); Kaoru Suzuki, Tokyo (JP)

(73) Assignee: Anelva Corporation, Tokyo (JP)

( * ) Notice: Subject to any disclaimer, the term of this patent is extended or adjusted under 35 U.S.C. 154(b) by 338 days.

(21) Appl. No.: 10/132,427

(22) Filed: Apr. 26, 2002

(65) Prior Publication Data
US 2002/0157610 A1 Oct. 31, 2002

(30) Foreign Application Priority Data
Apr. 27, 2001 (JP) .......................... 2001-132771

(51) Int. Cl.[7] .............................................. C23C 16/06
(52) U.S. Cl. .................... 427/250; 427/255.7; 427/535; 205/291
(58) Field of Search .......................... 427/250; 204/192; 205/291

(56) References Cited

U.S. PATENT DOCUMENTS

| | | | | |
|---|---|---|---|---|
| 6,423,201 B1 | * | 7/2002 | Mandrekar | 205/186 |
| 6,482,740 B2 | * | 11/2002 | Soininen et al. | 438/686 |
| 6,485,618 B2 | * | 11/2002 | Gopalraja et al. | 204/192.17 |
| 6,491,978 B1 | * | 12/2002 | Kalyanam | 427/255.394 |
| 6,562,219 B2 | * | 5/2003 | Kobayashi et al. | 205/186 |

* cited by examiner

*Primary Examiner*—Bret Chen
(74) *Attorney, Agent, or Firm*—Wenderoth, Lind & Ponack, L.L.P.

(57) ABSTRACT

A method for forming a Cu thin film on a substrate includes a Cu-CVD step forming a first copper film on predetermined surface of a substrate by a CVD process and a plating step further forming a second copper film on the first copper film by an eletrolytic copper plating process using the first copper film as an electrode. A modifying step modifies the first copper film by exposing it in an active atmosphere between the Cu-CVD step and the plating step. Fine voids can thereby be effectively prevented from being formed in the vicinity of the interface between the first copper film and the second copper film.

40 Claims, 6 Drawing Sheets

Fig.1 (a) (prior art)
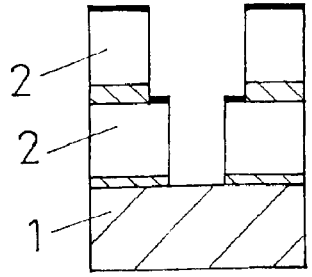
Fig.1 (b) (prior art)
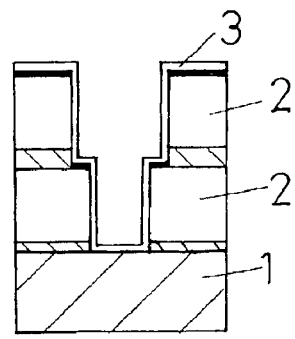
Fig.1 (c) (prior art)
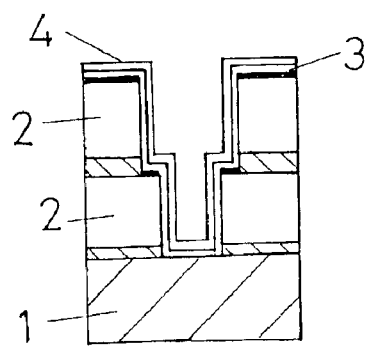
Fig.1 (d) (prior art)
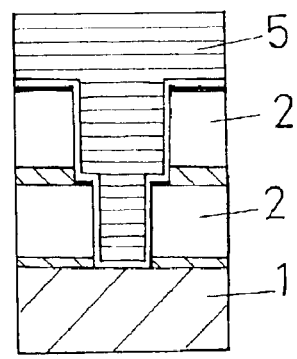
Fig.1 (e) (prior art)
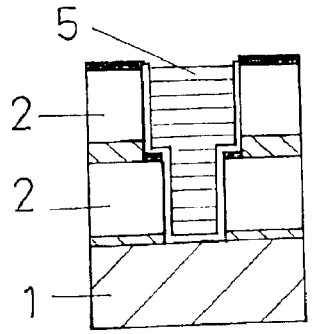

Fig.2 (a) (prior art)
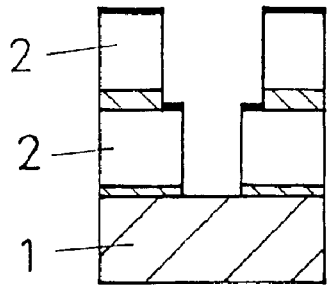
Fig.2 (b) (prior art)
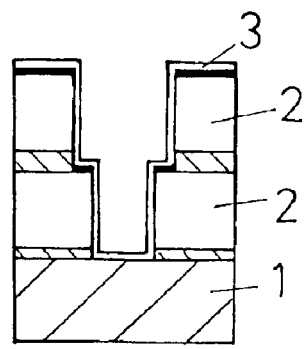
Fig.2 (c) (prior art)
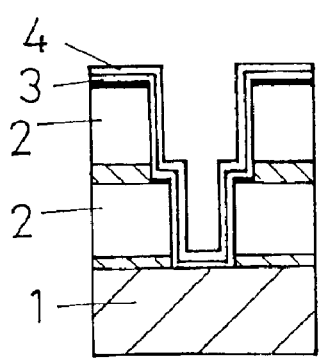
Fig.2 (d) (prior art)
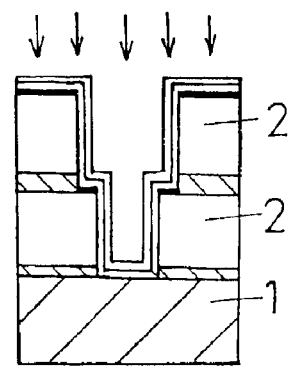
Fig.2 (e) (prior art)
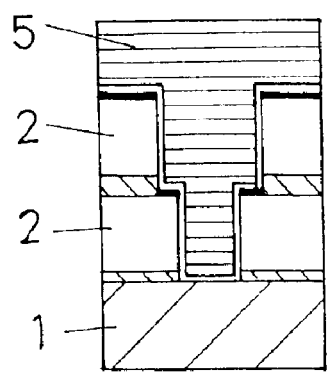
Fig.2 (f) (prior art)
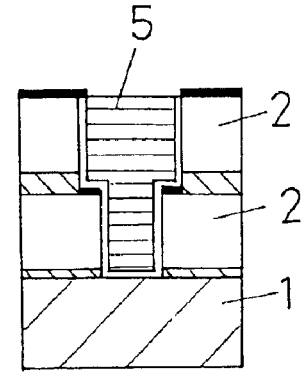

Copper thin film (conventional example) where second copper film is formed on first copper film (Cu-Seed film)

Copper thin film (conventional example) where second copper film is formed on first copper film (Cu-Seed film)

METHOD FOR FORMING A COPPER THIN FILM

BACKGROUND OF THE INVENTION

1. Field of the Invention

The present invention relates to a method for forming a Cu thin film, and in particular, to a method for forming a Cu thin film suitable for forming a Cu thin film for wiring, where a copper film is formed on a diffusion barrier film formed on an insulating film formed on a substrate to be processed and provided with a recessed portion, and the recessed portion is filled with copper material.

2. Description of the Related Art

In recent years, according to high performance orientation of semiconductor devices, Cu (copper) has been used as wiring material. The reason is that Cu has a lower electrical resistance than that of Al (aluminum), and Cu has a high resistance to a phenomenon such as stress migration and electro-migration where diffusion behavior of metal atoms constituting wiring is dominant.

In forming a wiring using Cu, a pattern of wiring and connection hole (via hole, or contact hole) is formed on an insulating film, a barrier film is then formed on the said insulating film, a copper (Cu) film is embedded into a patterned recessed portion, and an extra copper film or the like is removed by CMP (chemical mechanical polishing).

The method for forming a Cu thin film which has been used conventionally will be explained with reference to FIGS. 1(a) to 1(e). An insulating film 2 formed on a substrate (semiconductor substrate) 1 and provided with a recessed portion is etched in a predetermined pattern as shown in FIG. 1(a). A base barrier film 3 is formed by PVD process, as shown in FIG. 1(b). Next, as shown in FIG. 1(c), a first copper film 4 is formed by PVD process. This first copper film 4 (as a deposition film) is referred to as a Cu-Seed film, and serves as a base film for an electrolytic copper plating electrode. Then, as shown in FIG. 1(d), a second copper film denoted by reference numeral 5 is embedded into a predetermined pattern of the insulating film 2 using an electrolytic plating apparatus and utilizing the first copper film (Cu-Seed film) 4 as an electrode. Further, as shown in FIG. 1(e), an extra copper film or the like is removed by CMP (chemical mechanical polishing).

The second Cu film 5 embedded in the above manner will be used as wiring for a device. According to advances in integration of devices in recent years, it is required to form a barrier film and a Cu-Seed film having an excellent covering property to fine and deep holes or grooves. The method for embedding the electrolytic copper plating in the predetermined pattern of the insulating film has been employed, since it is economical. But, in the electrolytic copper plating, it is necessary to form the first copper film serving as the Cu-Seed film in advance, as described above.

As one method or process to which attention has been paid as a method for forming the first copper film serving as this Cu-Seed film with an excellent covering property, there is a CVD process (chemical vapor deposition process) using an organic metal compound or an organic metal complex as raw material.

A conventional method for forming a Cu thin film for wiring using a CVD process for forming a first copper film serving as a Cu-Seed film will be explained with reference to FIGS. 2(a) to 2(f). An insulating film 2 formed on a substrate (semiconductor substrate) 1 and provided with a recessed portion is etched in a predetermined pattern, as shown in FIG. 2(a). A base barrier film (for example, TiN film) 3 is formed on the insulating film 2, for example, by a MOCVD (Metal Organic Chemical Vapor Deposition) process, as shown in FIG. 2(b). Then, as shown in FIG. 2(c), a first copper film 4 (as a deposition film) serving as a Cu-Seed film is formed by a CVD process. Further, as shown in FIG. 2(e), a second copper film denoted by reference numeral 5 is embedded into a predetermined pattern of the insulating film 2 using an electrolytic plating apparatus where the first copper film 4 serving as the Cu-Seed film is used as an electrode. Finally, extra or excess copper film or the like is removed by CMP (chemical mechanical polishing), as shown in FIG. 2(f). In this method, after the first copper film 4 has been formed, a heating (annealing) process can be interposed, as shown in FIG. 2(d), for improving adhesion, and the first copper film 4 which has been subjected to the annealing process is used as the Cu-Seed film. Also, although it is not shown, after the base barrier film 3 is formed, a plasma process may be interposed in order to improve adhesion prior to formation of the first copper film 4.

In the conventional method for forming a Cu thin film for wiring, as described above, the CVD process using an organic metal compound or an organic metal complex as the raw material is employed to form the first copper film serving as the Cu-Seed film, whereby it becomes possible to form a first copper film (Cu-Seed film) which can correspond to a fine pattern.

However, when a section of the film plated with electrolytic copper in the state shown in FIG. 2(e) in the conventional method for forming a Cu thin film for wiring using the CVD process is observed by a SEM (scanning electron microscope), it has been found that there are fine voids in the vicinity of a boundary or interface region between the first copper film and the second copper film formed by the electrolytic copper plating as shown in FIGS. 3 and 4.

These voids deteriorate interface characteristics of the second copper film formed by the electrolytic copper plating on the first copper film (Cu-Seed film), which is in an as-deposited state. When the Cu thin film thus formed is used as wiring, there occurs a drawback such as increase in wiring resistance, reduction in electro-migration resistance or the like.

Regarding the semiconductor circuit devices, current operation speeds thereof are required to be further enhanced. It is essential to reduce the resistance in wiring in order to manufacture such high speed devices. As described above, however, if the wiring resistance is increased due to the existence of fine voids in the vicinity of the interface between the first copper film (Cu-Seed film), which is in the as deposited state, and the second copper film formed thereon by the electrolytic copper plating, such increase may result in a fatal defect in manufacturing of a high speed device.

Furthermore, according to increases in integration density of a semiconductor circuit components, a wiring portion is made fine and the density of current flowing in this portion is increased. For this reason, it is requested for wiring to have a further increased electro-migration resistance than that of conventional wiring. Thus reductions in electro-migration resistance may also result in a fatal defect in manufacturing a high speed device.

SUMMARY OF THE INVENTION

In view of the above described problem, an object of the present invention is to propose a method for forming a Cu thin film including a forming step of first copper film (as deposition film), which serves as a Cu-Seed film, by a CVD process with an excellent covering property and a plating step of forming a second copper film on the first copper film by an electrolytic copper plating using the first copper film as an electrode, with effectively preventing fine voids from being generated in the vicinity of an interface between the first copper film and the second copper film.

The present invention has solved the above problem by, after the first copper film serving as the Cu-Seed film is formed by a CVD process with an excellent covering property, adopting a modifying step processing the first copper film in an active atmosphere prior to the plating step where the first copper film is used as an electrode for an electrolytic copper plating, and utilizing the first copper film thus modified as the Cu-Seed film.

That is, a method for forming Cu thin film proposed by the present invention comprises a Cu-CVD step of forming a first copper film on a predetermined surface of a substrate such as a semiconductor substrate or the like, for example, a predetermined surface of an insulating film formed on a semiconductor substrate and formed with a recessed portion, by a CVD process, and a plating step of further forming a second copper film on the first copper film by an electrolytic copper plating using the first copper film as an electrode. A modifying step performs modification by exposing the first copper film, which is in an as-deposited state, in an active atmosphere is interposed between the Cu-CVD step and the plating step.

Here, as a means for creating the active atmosphere for the modifying step, either of plasma and free activated species created by thermally decomposing molecules can be employed.

Also, it is preferable that the modifying step is conducted in an active atmosphere where any gas containing hydrogen exists. It is further preferable that the modifying step is conducted while the temperature of the substrate is being maintained in a temperature range of −100° C. to 250° C.

Further, it is preferable that the modifying step is conducted in the same vacuum as the Cu-CVD step. Also, it is preferable that an adhesion improving step is interposed at least one time before the Cu-CVD step, between the Cu-CVD step and the modifying step, and between the modifying step and the plating step.

As the before described adhesion improving step, a conventionally known plasma process or an annealing process can be adopted.

According to a method for forming a Cu thin film of the present invention, in a formation of a Cu thin film including a step of forming a first copper film (as a deposition film) serving as a Cu-Seed film by a CVD process with an excellent covering property and a step of forming a second copper film on the first copper film by an electrolytic copper plating process, fine voids can be effectively prevented from being generated in the vicinity of the interface between the first copper film and the second copper film formed thereon by the electrolytic copper plating process.

As a result, a method for forming a Cu thin film of the present invention can be applied to fabrication of a semiconductor device with a small wiring resistance, which can result in a device having a further enhanced operation speed. Also, the present invention is also applicable to fabrication of wiring which is requested to have a further improved electro-migration resistance, since the wiring portion is made finer according to increases in integration of semiconductor circuit components and the density of current flowing in this finer portion is increased.

Also, it is expected that a dual damascene or a borderless wiring configuration is further advanced in the future. In the dual damascene, a SiN film used as an etch stop layer thereof is put in an overhanging state during formation of a through hole or a groove of the dual damascene. It has been tried to form a Cu-Seed film just below the overhung SiN film using a Cu-CVD process with an excellent step covering property.

If a method for forming a Cu thin film forming method of the present invention is applied to a case that a first copper film (as a deposition film) serving as a Cu-Seed film is formed just below an overhung SiN film and a second copper film is formed by an electrolytic copper plating process using the first copper film as an electrode, fine voids can be effectively prevented from being formed in the vicinity of the interface between the first copper film and the second copper film formed thereon by the electrolytic copper plating process.

BRIEF DESCRIPTION OF THE DRAWINGS

FIGS. 1(a) to 1(e) are diagrams for explaining steps of a conventional method for forming a Cu thin film for wiring;

FIGS. 2(a) to 2(f) are diagrams for explaining steps of another conventional method for forming a Cu thin film for wiring;

DESCRIPTION OF THE PREFERRED EMBODIMENTS

A preferred embodiment of the present invention will be explained with reference to the drawings.

Figure 5:
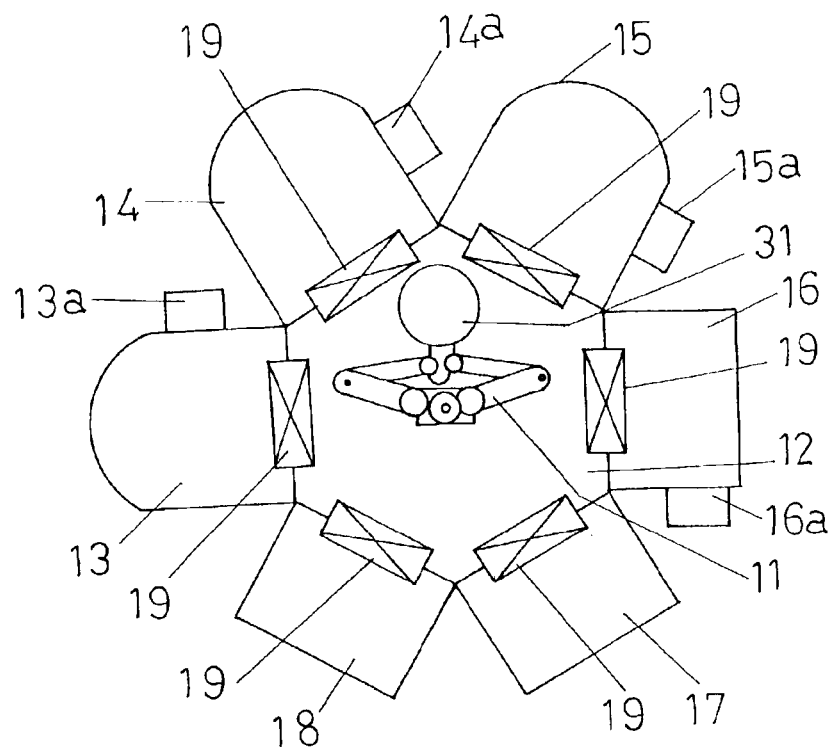
FIG. 5 is a schematic configuration example of a system which can be used for a method for forming a Cu thin film according to the present invention.

A system shown in FIG. 5 can be used in a method for forming a Cu thin film of the present invention is applied in forming a Cu thin film for wiring. A first copper film is formed on a diffusion film formed on an insulating film formed on a substrate to be processed and provided with a recessed portion. The recessed portion is then filled with copper material. That is to say, FIG. 5 shows one preferred embodiment of a system conducting a series of steps of the method of present invention, as shown by FIGS. 7(a) to 7(f). These steps include a step in which a base film for a diffusion barrier (for example, TiN film) 33 is formed on an insulating film 32 formed on a semiconductor substrate 31 and provided with a recessed portion, a step in which a first copper film (as a deposition film) 34 is formed on the base film by a Cu-CVD process, and a step that a modifying process is conducted on the first copper film 34 which is in an as deposited state.

In this case, for example, the insulating film 32 may be an organic film with a low dielectric constant. In addition, the base film for diffusion barrier 33 is not limited to TiN film, but a metal film with a high melting point such as Ta, TaN, WxN, TiSiN or the like may be used as the base film for the diffusion barrier. Also, the process for forming the base film for the diffusion barrier 33 is not limited to the CVD process, and a sputtering process may be used for forming the base film.

FIG. 5 shows one example where the Cu thin film forming system, which can be used for the Cu thin film forming method of the present invention, is constituted as a multichamber system. A separation chamber (transfer chamber) 12 having a built-in transfer robot (a substrate transfer mechanism) 11 is provided at a central portion of the system. A TiN-CVD chamber 13 for forming diffusion barrier, a Cu-CVD chamber 14, a modification process chamber 15, and an annealing chamber 16 are disposed around the separation chamber 12, and two load/unload modules 17 and 18 are also provided in an additional manner. Respective chambers are provided with evacuating mechanisms 13a, 14a, 15a and 16a. Also, respective chambers are provided with gate valves 19. Operations of the evacuating mechanisms 13a, 14a, 15a and 16a are controlled by a controller (not shown) so that the insides of the respective chambers are properly maintained at reduced pressures, or in desired vacuum states. Also, flow control of process gases, etc. used in the each respective chambers is performed by a controller (not shown).

The term "module" used here means a section or portion constituting an apparatus/a machine/a system and a portion which is functionally integrated. Therefore, the above-described TiN-CVD chamber 13, Cu-CVD chamber 14, modification process chamber 15, and annealing chamber 16 are respectively constituted as modules, and the chambers are used as the terms indicating the places where these processes are conducted.

The transfer robot (substrate transfer mechanism) 11 is provided inside of the separation chamber 12, and the transfer robot 11 transfers a substrate 31 in to each chamber, etc. or out therefrom using its hand. In the above system, a sheet of a substrate (semiconductor substrate) 31 set in a cassette (not shown) is transferred into the separation chamber 12 from a load/unload lock module 18 illustrated on the left side on the figure by the transfer robot 11.

Each process chamber of the TiN-CVD chamber 13 for forming the diffusion barrier, the Cu-CVD chamber 14, the modification process chamber 15 and the annealing chamber 16 is provided with a substrate supporting mechanism (not shown) on which the substrate (semiconductor substrate) 31, transferred into each process chamber by the transfer robot 11, can be disposed. The substrate supporting mechanism (not shown) is provided with a substrate heating mechanism (not shown) which can maintain a substrate (semiconductor substrate) 31 at a predetermined temperature, and the process of each step proceeds in a state where the substrate (semiconductor substrate) 31 is disposed on the substrate supporting mechanism.

One example of a process using a system shown in FIG. 5, and a method for forming a Cu thin film of the present invention employed, for example, in forming a Cu thin film for wiring will be explained.

Figure 7:
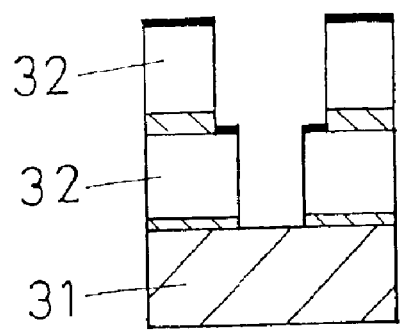
FIGS. 7(a) to 7(f) are diagrams for explaining steps of one embodiment where a method for forming a Cu thin film according to the present invention is applied to a method for forming a Cu thin film for wiring.
Figure 7:
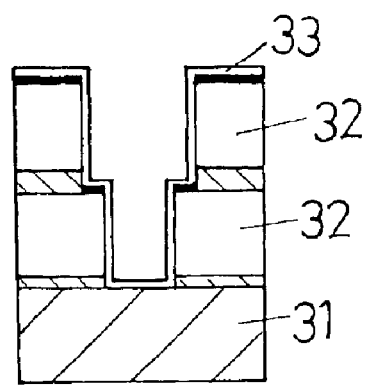
Figure 7:
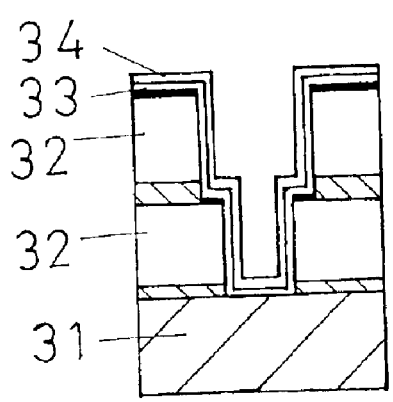
Figure 7:
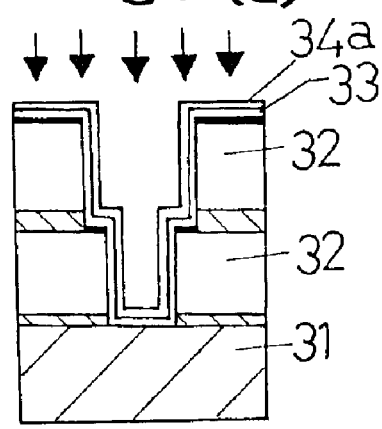
Figure 7:
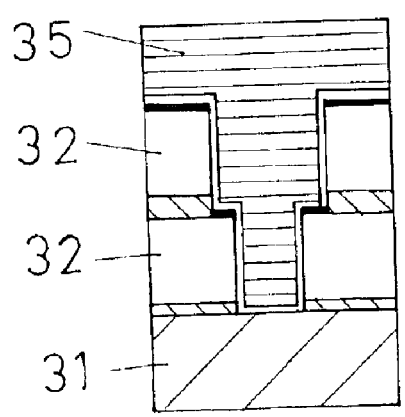
Figure 7:
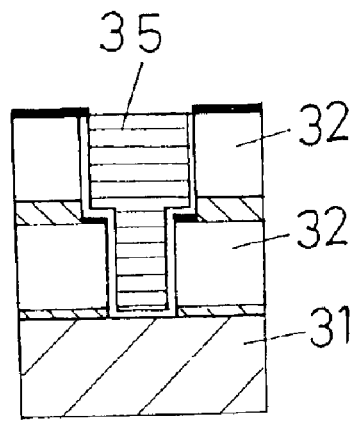

As shown in FIG. 7(b), in the TiN-CVD chamber 13 for forming the diffusion barrier, a TiN film 33 serving as a base film for the diffusion barrier is formed by a MOCVD (Metal Organic Chemical Vapor Deposition) process on an insulating film 32 which is formed on a substrate (semiconductor substrate) 31 and is provided with a recessed portion.

Next, in the Cu-CVD chamber 14, as shown in FIG. 7(c), a first copper film 34 is formed by a CVD process. After the first copper film 34, which is in an as-deposited state, is formed in this manner, a modifying process, which is essential in the Cu thin film forming method of the present invention and which performs modification of the first copper film (as-deposited film) 34 by exposing the first copper film 34 in an active atmosphere, is conducted in a step shown in FIG. 7(d).

In the system of the configuration shown in FIG. 5, this modifying process is conducted in the modification process chamber 15 as a process where the first copper film 34 is exposed in plasma. The modified first copper film 34 (represented as a Cu-Seed film 34a in FIG. 7(d)), which has been subjected to the modifying process just before being moved to an electrolytic plating step shown in FIG. 7(e), is thus formed.

If it is necessary, an adhesion improving step for improving adhesion may be interposed at least one time before the Cu-CVD step (FIG. 7(c)), between the Cu-CVD step (FIG. 7(c)) and the modifying step (FIG. 7(d)), and after the modifying step (FIG. 7(d)). For example, two adhesion improving steps may be interposed as follows. After the TiN film 33 serving as the base film for the diffusion barrier has been formed (FIG. 7(b)) and before the first copper film 34 is formed in the Cu-CVD step (FIG. 7(c)), the first adhesion improving step may be interposed, and after the first copper film 34 has been formed in the Cu-CVD step (FIG. 7(c)) and before the modifying process is conducted (FIG. 7(d)), the second adhesion improving step may be interposed.

As the adhesion improving step, an annealing process can be conducted in the system shown in FIG. 5, because the system has the annealing chamber 16. Alternatively, as the adhesion improving step, a plasma processing can be conducted instead of an annealing process.

The substrate (semiconductor substrate) 31 which has been subjected to the series of processes as before-described is returned back to the load/unload lock module 17 by the transfer robot 11. After the load/unload lock chamber is opened, the substrate is advanced to a plating step shown in FIG. 7(e).

As described above, the Cu thin film forming method according to the present invention includes a series of Cu thin film forming steps of forming a first copper film 34, which is in an as-deposited state on a surface of a substrate (semiconductor substrate) 31, by a Cu-CVD process, and forming a second copper film 35 on the first copper film 34 by an electrolytic plating process, in which a modifying step, which performs modification of the first copper film 34 as shown in FIG. 7(d), is provided after the first copper film 34 is formed. The second copper film 35 is formed by electrolytic copper plating on the first copper film 34 subjected to the modifying step utilizing the modified first copper film 34 as a Cu-Seed film 34a.

One embodiment of process conditions, in case that a method for forming a Cu thin film of the present invention using the system shown in FIG. 5 is applied to the formation of a Cu thin film for wiring, will be explained below.

In the TiN CVD chamber 13 for forming a diffusion barrier, first, a TiN CVD film forming step is conducted. A TiN film 33 serving as the base film for a diffusion barrier is formed by a MOCVD process on the insulating film 32 formed on the substrate (semiconductor substrate) 31 and provided with the recessed portion. In this process, the pressure in the TiNCVD chamber 13 for forming diffusion barrier is set, for example, in a range of 0.1 to 15 Pa and the substrate (semiconductor substrate) 31 is heated to a range of about 300 to 400° C. In this state, TDAAT (tetraoxo dialkyamino titanium) is supplied in a range of 0.004 to 0.2 g/min as material gas. At this time, carrier gas (Ar: argon gas) added for improving the fluidity of the material gas in a piping is set in a flow rate range of about 0.05 to 3.0 g/min (about 30 to 170 ml/min). Additional gas ($NH_3$ ammonia gas) is supplied, for example, in a flow rate range of 0.76 to 380 mg/min. Under the above conditions, the diffusion barrier film 33 as shown in FIG. 7(b) was formed to a film thickness of 10 nm.

Next, the substrate (semiconductor substrate) 31 which was subjected to the above TiNCVD film forming step is transferred into the Cu-CVD chamber 14, where the first copper film 34 is formed on the TiN film 33, serving as the base film for a diffusion barrier, by a CVD process as shown in FIG. 7(c). The internal pressure in the Cu-CVD chamber 14 is maintained, for example, at 1.0 KPa and the temperature of the substrate (semiconductor substrate) 31 is set to about 170° C. In this state, using Cu(hfac)(tmvs) (trimethylvinyl hexafluoro acetylacetonate acid salt copper I), the first copper film 34, in an as deposited state, is formed as shown in FIG. 7(c).

The substrate (semiconductor substrate) 31 which has been subjected to the forming step of the first copper film 34 is transferred into a vacuum chamber 21a of the modification process chamber 15. The schematic configuration is explained by one example in FIG. 6. Transfer in by the transfer robot 11 via the gate valve 19, and the substrate 31 is disposed on the substrate supporting mechanism 23. Next, a modification process is performed in the following manner, for example.

First, Ar gas is introduced into a vacuum chamber 21a via a gas supplying device 22 provided so as to be opposed to the substrate supporting mechanism 23. An evacuating mechanism 15a is provided to the side of gas exhausting chamber 21b and the evacuating mechanism is actuated so that the inside of the vacuum chamber 21a is maintained at a predetermined degree of vacuum. High frequency power is supplied to the substrate supporting mechanism 23 from a high frequency power source 25 connected to the substrate supporting mechanism 23 via a matching circuit 26 to produce plasma discharge in the vacuum chamber 21a, and the substrate (semiconductor substrate) 31 is exposed to the produced plasma of Ar gas.

As process conditions for the above-described modification process, the following conditions are adopted as one example. The temperature of the substrate (semiconductor substrate) 31 is maintained at room temperature. Ar gas is introduced in a flow rate range of 200 ml/min. The modification process chamber 15 is maintained in a vacuum degree of 0.7 Pa. High frequency power with a frequency of 60 MHz is supplied to the substrate supporting mechanism 23 in an amount of 200W, and plasma discharge is maintained for 40 seconds.

As demonstrated in the following test example, under the above-described conditions, if Ar gas mixed with $H_2$ gas is introduced instead of Ar gas, it is more advantageous because fine voids are more effectively prevented from being generated in the vicinity of the interface between the first copper film 34 and the second copper film 35 formed thereon by the electrolytic plating process. For example, in the above process conditions, instead of Ar gas, 3% $H_2$/Ar gas can be introduced in the flow rate of Ar gas of the above-mentioned process conditions.

Also, in the Cu thin film forming method of the present invention described above, it is preferable that the respective processing steps are sequentially advanced in a vacuum atmosphere without exposing the substrate (semiconductor substrate) 31 under the atmosphere until the modification step (the plasma processing step in the above case) performed in the modification process chamber 15 is completed.

TEST EXAMPLE

Figure 3:
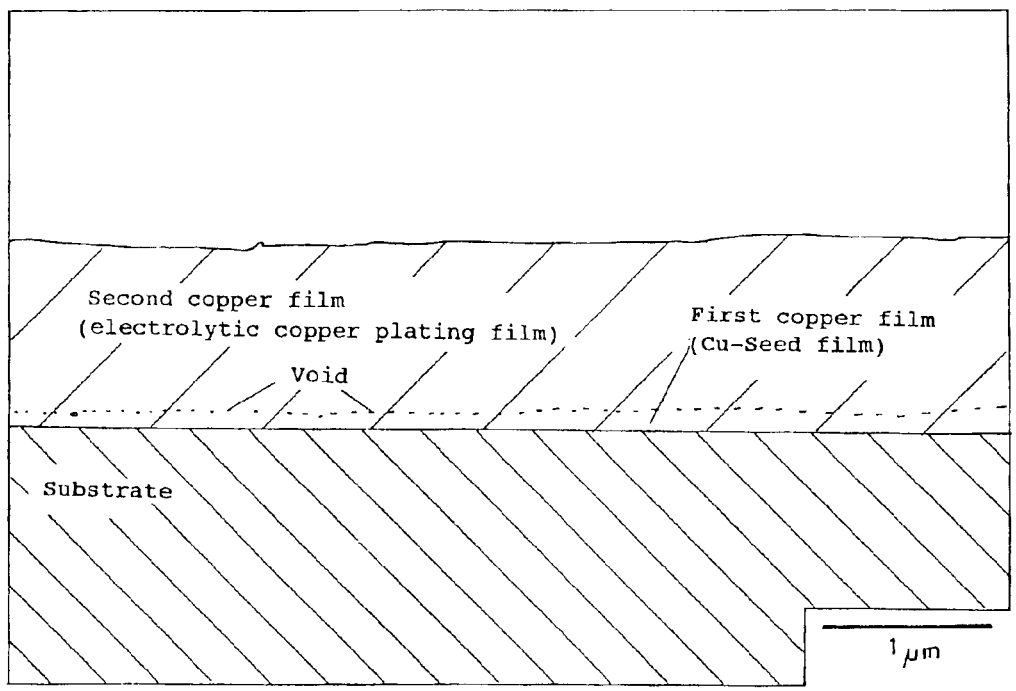
FIG. 3 is an enlarged sectional view for explaining a state of a film section of a plated Cu thin film formed by the conventional method for forming a Cu thin film for wiring explained in FIGS. 2(a) to 2(f)
Figure 4:
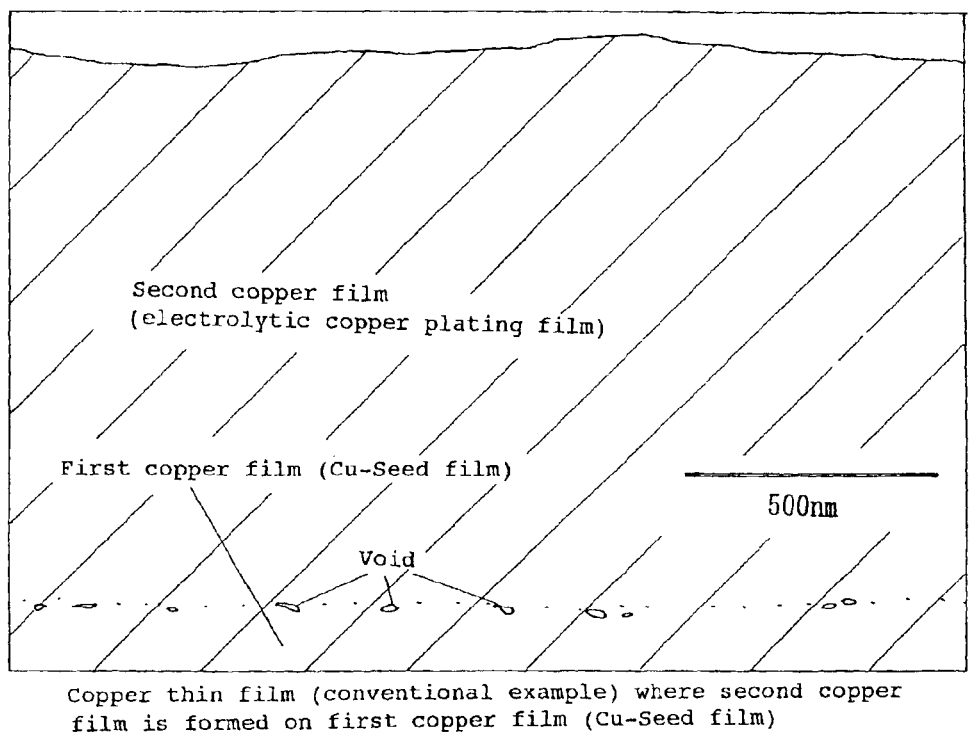
FIG. 4 is an enlarged sectional view which shows the state of the film section of the plated Cu thin film in the vicinity of an interface between a first copper film and a second copper film by further enlarging the state shown in FIG. 3.

Regarding a sample substrate which was obtained by further forming the second copper film 35 on the first copper film 34 by the electrolytic copper plating process using the first copper film 34 (Cu-Seed film 34a) as an electrode, the section of the film of the sample substrate which was plated was observed with a SEM (scanning electron microscope). The first copper film 34(Cu-seed film 34a) has been modified through the above-described process. A sample substrate which was subjected to a modification process using plasma of Ar gas and a sample substrate which was subjected to a modification process using plasma of Ar gas mixed with $H_2$ gas were observed with the same magnification as the conventional case shown in FIGS. 3 and 4. In both the sample substrates, it was not found that any void existed in the vicinity of the interface between the first copper film (Cu-Seed film) and the second copper film formed thereon by the electrolytic copper plating process.

Regarding the above sample substrates formed through the above-described processing process, observation was performed with further large magnification in order to compare the sample substrate which was subjected to the modification process using the plasma of Ar gas and the sample substrate which was subjected to the modification process using the plasma of Ar gas mixed with $H_2$ gas. Regarding the sample substrate which was modification-processed using the plasma of Ar gas, it was found that there were a slight number of fine voids in the vicinity of the interface between the first copper film and the second copper film formed thereon by the electrolytic copper plating process. However, in a case that the modification was performed using the plasma of Ar gas mixed with $H_2$ gas(3% $H_2$/Ar gas), even when observation was performed with the same magnification, it was not found that any fine voids existed in the vicinity of the interface between the first copper film and the second copper film formed thereon by the electrolytic copper plating process. Therefore, it is considered that it is further preferable to use the plasma of Ar gas mixed with $H_2$ gas in order to prevent fine voids from being generated in the vicinity of the interface between the first copper film serving as the Cu-Seed film and the second copper film formed thereon.

A preferable embodiment of the present invention has been explained as described above with reference to the accompanying drawings. The present invention is not limited to the above described embodiment, and the invention may be modified to various embodiments within the technical scope understood from the invention described in the attached claims.

For example, as a means creating an active atmosphere in the modifying step where the modification is conducted by exposing the first copper film in the active atmosphere between the Cu-CVD step and the plating step, free activated species created by thermally decomposing molecules can be employed instead of plasma.

In this case, the modification process chamber 15 is a modification process chamber of a system where material gas is introduced while a heating element made from a high melting point metal such as tungsten and disposed in a chamber which can be evacuated is maintained at a high temperature of 1000° C. to 2000° C. or so. The material gas is decomposed and/or activated when it passes through the surface of the heating element. This chamber may be adopted in the system shown in FIG. 5, and such a constitution can be employed that Ar gas or Ar gas mixed with $H_2$ gas is introduced as the material gas.

Figure 6:
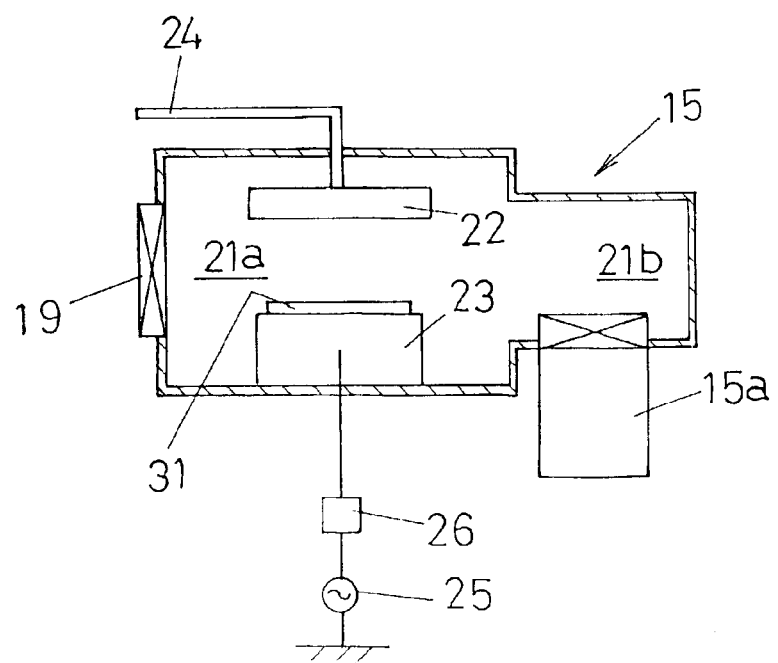
FIG. 6 is a sectional view showing a schematic configuration example of a modification process chamber which can be used for a method for forming a Cu thin film according to the present invention.

As the modification process chamber 15 shown in FIG. 6 which performs the plasma processing, a conventional known plasma CVD chamber can be modified and used, and a conventional known heating element CVD chamber can be modified and used as the modification processing chamber, where the free activated species created by decomposing molecules is employed as the means for producing the active atmosphere.

When a modification is performed by exposing the first copper film in an active atmosphere between the Cu-CVD step and the plating step, even in the case that the above-described plasma is used as the means for creating an active atmosphere or even in the case that the free activated species created by decomposing molecules is used as the means, it is preferable that the temperature of the substrate (semiconductor substrate) 31 is maintained in the range of −100° C. to 250° C. This is to prevent copper atoms in the formed first copper film 34 from moving by conducting the modification process in a temperature range which is not so higher than the film forming temperature range (normally, about 200° C.) of the pre-stage Cu-CVD step for forming the first copper film 34. The first copper film 34 has a thickness which meets its function of acting as an electrode in the electrolytic copper plating step conducted succeedingly. The thickness should be thinner in view of the cost, and the thickness is generally set to about 100 nm or less. In order to prevent the temperature of the substrate (semiconductor substrate) 31 from rising due to irradiation by plasma, radiation heat received from the heating element or the like, and to prevent fluidization or agglomeration due to movement of copper atoms, it is desirable that the substrate (semiconductor substrate) 31 under the modification process be maintained in a temperature range which is not so higher than the film forming temperature range in the Cu-CVD step, and preferably in a temperature range lower than the film forming temperature range in the Cu-CVD step. But, when the temperature of the substrate 31 becomes lower than the temperature (−100° C.) of liquid nitrogen, liquid nitrogen can not be used as coolant in practice. Therefore, the lowest limit of the temperature which can achieve cost reduction or simplification of a system will be 100° C. in practice.

The temperature adjustment of the substrate (semiconductor substrate) 31 during the modification process is performed by a temperature adjusting mechanism (not shown) provided in the substrate supporting mechanism 23.

What is claimed is:

1. A method for forming a Cu thin film comprising a Cu-CVD step of forming a first copper film on a predetermined surface of a substrate by a CVD process and a plating step further forming a second copper film on the first copper film by an electrolytic copper plating process using the first copper film as an electrode,
wherein a modifying step modifying the first copper film by exposing it in an active atmosphere is interposed between the Cu-CVD step and the plating step.

2. The method for forming a Cu thin film according to claim 1, wherein a plasma is used for producing the active atmosphere in the modifying step.

3. The method for forming a Cu thin film according to claim 2, wherein the modifying step is conducted in the active atmosphere where any gas containing hydrogen exists.

4. The method of for forming a Cu thin film according to claim 2, wherein the modifying step is conducted while the temperature of the substrate is being maintained in a range of −100° C. to 250° C.

5. The method for forming a Cu thin film according to claim 2, wherein the modifying step is conducted in the same vacuum as the Cu-CVD step.

6. The method for forming a Cu thin film according to claim 2, wherein an adhesion improving step is conducted at least one time before the Cu-CVD step, between the Cu-CVD step and the modifying step, and between the modifying step and the plating step.

7. The method for forming a Cu thin film according to claim 1, wherein a free activated species created by thermally decomposing molecules is used for producing the active atmosphere in the modifying step.

8. The method for forming a Cu thin film according to claim 7, wherein the modifying step is conducted in the active atmosphere where any gas containing hydrogen exists.

9. The method of for forming a Cu thin film according to claim 7, wherein the modifying step is conducted while the temperature of the substrate is being maintained in a range of −100° C. to 250° C.

10. The method for forming a Cu thin film according to claim 7, wherein the modifying step is conducted in the same vacuum as the Cu-CVD step.

11. The method for forming a Cu thin film according to claim 7, wherein an adhesion improving step is conducted at least one time before the Cu-CVD step, between the Cu-CVD step and the modifying step, and between the modifying step and the plating step.

12. The method for forming a Cu thin film according to claim 1, wherein the modifying step is conducted in the active atmosphere where any gas containing hydrogen exists.

13. The method of for forming a Cu thin film according to claim 12, wherein the modifying step is conducted while the temperature of the substrate is being maintained in a range of −100° C. to 250° C.

14. The method for forming a Cu thin film according to claim 12, wherein the modifying step is conducted in the same vacuum as the Cu-CVD step.

15. The method for forming a Cu thin film according to claim 12, wherein an adhesion improving step is conducted at least one time before the Cu-CVD step, between the Cu-CVD step and the modifying step, and between the modifying step and the plating step.

16. The method of for forming a Cu thin film according to claim 1, wherein the modifying step is conducted while the temperature of the substrate is being maintained in a range of −100° C. to 250° C.

17. The method for forming a Cu thin film according to claim 16, wherein the modifying step is conducted in the same vacuum as the Cu-CVD step.

18. The method for forming a Cu thin film according to claim 16, wherein an adhesion improving step is conducted at least one time before the Cu-CVD step, between the Cu-CVD step and the modifying step, and between the modifying step and the plating step.

19. The method for forming a Cu thin film according to claim 1, wherein the modifying step is conducted in the same vacuum as the Cu-CVD step.

20. The method for forming a Cu thin film according to claim 1, wherein an adhesion improving step is conducted at least one time before the Cu-CVD step, between the Cu-CVD step and the modifying step, and between the modifying step and the plating step.

21. A method for forming a Cu thin film comprising:
forming a first copper film on a predetermined surface of a substrate by a CVD process,
after said forming a first copper film, modifying the first copper film by exposing the first copper film in an active atmosphere, the active atmosphere being produced by one of (a) plasma and (b) a free activated species created by thermally decomposing molecules; and
after said modifying the first copper film, forming a second copper film on the first copper film by an electrolytic copper plating process that uses the first copper film as an electrode.

22. The method of claim 21, wherein said modifying the first copper film by exposing the first copper film in the active atmosphere comprises the active atmosphere being produced by plasma.

23. The method of claim 22, wherein the active atmosphere of said modifying comprises a gas containing hydrogen.

24. The method of claim 22, wherein said modifying is carried out while maintaining the temperature of the substrate in a range of −100° C. to 250° C.

25. The method of claim 22, wherein the substrate is advanced to said modifying from said forming a first copper film while maintaining the substrate in a vacuum atmosphere.

26. The method of claim 22, and further comprising carrying out adhesion improvement at least one time of (a) before said forming a first copper film, (b) between said forming a first copper film and said modifying, and (c) between said modifying and said forming a second copper film.

27. The method of claim 21, wherein said modifying the first copper film by exposing the first copper film in an active atmosphere comprises the active atmosphere being produced by a free activated species created by thermally decomposing molecules.

28. The method of claim 27, wherein the active atmosphere of said modifying comprises a gas containing hydrogen.

29. The method of claim 27, wherein said modifying is carried out while maintaining the temperature of the substrate in a range of −100° C. to 250° C.

30. The method of claim 27, wherein the substrate is advanced to said modifying from said forming a first copper film while maintaining the substrate in a vacuum atmosphere.

31. The method of claim 27, and further comprising carrying out adhesion improvement at least one time of (a) before said forming a first copper film, (b) between said forming a first copper film and modifying, and (c) between said modifying and said forming a second copper film.

32. The method of claim 21, wherein the active atmosphere of said modifying comprises a gas containing hydrogen.

33. The method of claim 32, wherein said modifying is carried out while maintaining the temperature of the substrate in a range of −100° C. to 250° C.

34. The method of claim 32, wherein the substrate is advanced to said modifying from said forming a first copper film while maintaining the substrate in a vacuum atmosphere.

35. The method of claim 32, and further comprising carrying out adhesion improvement at least one time of (a) before said forming a first copper film, (b) between said forming a first copper film and said modifying, and (c) between said modifying and said forming a second copper film.

36. The method of claim 21, wherein said modifying is carried out while maintaining the temperature of the substrate in a range of −100° C. to 250° C.

37. The method of claim 36, wherein the substrate is advanced to said modifying from said forming a first copper film while maintaining the substrate in a vacuum atmosphere.

38. The method of claim 36, and further comprising carrying out adhesion improvement at least one time of (a) before said forming a first copper film, (b) between said forming a first copper film and said modifying, and (c) between said modifying and said forming a second copper film.

39. The method of claim 21, wherein the substrate is advanced to said modifying from said forming a first copper film while maintaining the substrate in a vacuum atmosphere.

40. The method of claim 21, and further comprising carrying out adhesion improvement at least one time of (a) before said forming a first copper film, (b) between said forming a first copper film and said modifying, and (c) between said modifying and said forming a second copper film.

* * * * *